(12) United States Patent
Kakumu et al.

(10) Patent No.: US 11,980,022 B2
(45) Date of Patent: May 7, 2024

(54) MEMORY DEVICE USING SEMICONDUCTOR ELEMENT

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 128 days.

(21) Appl. No.: 17/878,485

(22) Filed: Aug. 1, 2022

(65) Prior Publication Data

US 2023/0039991 A1 Feb. 9, 2023

(51) Int. Cl.
*G11C 16/04* (2006.01)
*G11C 5/06* (2006.01)
(Continued)

(52) U.S. Cl.
CPC .............. *H10B 12/20* (2023.02); *G11C 5/063* (2013.01); *G11C 11/4096* (2013.01); *H01L 29/0607* (2013.01); *H01L 29/7841* (2013.01)

(58) Field of Classification Search
CPC ...... H10B 12/20; G11C 5/063; G11C 11/4096
See application file for complete search history.

(56) References Cited

U.S. PATENT DOCUMENTS 4,075,653 A * 2/1978 Howard ................ H01L 29/792
327/581
2002/0114191 A1 8/2002 Iwata et al.
(Continued)

FOREIGN PATENT DOCUMENTS

JP 2003-086712 A 3/2003
JP 2003-188279 A 7/2003
JP 2004-303911 A 10/2004
JP 2008-147514 A 6/2006

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Transistor (SGT) for Ultra-High Density LSI's", IEEE Transaction on Electron Devices, vol. 38, No. 3, pp. 573-578 (1991).

(Continued)

*Primary Examiner* — Min Huang
(74) *Attorney, Agent, or Firm* — Crowell & Moring LLP

(57) ABSTRACT

An $n^+$ layer 3a connected to a source line SL at both ends, an $n^+$ layer 3b connected to a bit line BL, a first gate insulating layer 4a formed on a semiconductor substrate 1 existing on an insulating film 2, a gate conductor layer 16a connected to a plate line PL, a gate insulating layer 4b formed on the semiconductor substrate, and a second gate conductor layer 5b connected to a word line WL and having a work function different from a work function of the gate conductor layer 16a are disposed on the semiconductor substrate, and data hold operation of holding, near a gate insulating film, holes generated by an impact ionization phenomenon or gate-induced drain leakage current inside a channel region 12 of the semiconductor substrate 1 and data erase operation of removing the holes from inside the substrate 1 and the channel region 12 are performed by controlling voltage applied to the source line SL, the plate line PL, the word line WL, and the bit line BL.

4 Claims, 8 Drawing Sheets

(51) Int. Cl.
  *G11C 11/4096* (2006.01)
  *H01L 29/06* (2006.01)
  *H01L 29/78* (2006.01)
  *H10B 12/00* (2023.01)

(56) References Cited

U.S. PATENT DOCUMENTS

| | | | | |
|---|---|---|---|---|
| 2003/0111681 | A1* | 6/2003 | Kawanaka | H01L 29/7841 |
| | | | | 257/E27.098 |
| 2006/0157738 | A1 | 7/2006 | Kawanaka | |
| 2008/0137394 | A1* | 6/2008 | Shimano | G11C 11/405 |
| | | | | 365/72 |
| 2012/0146146 | A1 | 6/2012 | Anderson et al. | |
| 2012/0286347 | A1* | 11/2012 | Terai | H01L 29/792 |
| | | | | 257/316 |
| 2014/0117450 | A1 | 5/2014 | Anderson et al. | |
| 2017/0229471 | A1* | 8/2017 | Kim | G11C 16/0408 |
| 2018/0197613 | A1* | 7/2018 | Hsu | G11C 16/14 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).
H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).
K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007) pp. 767-770.
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transactions on Electron Devices, pp. 1-9 (2015).
M. G. Ertoosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).
F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., vol. E90-C, No. 4 pp. 765-771 (2007).
Initial Patent Examination Report (PCT/IPEA/409) (Japanese) from PCT/JP2021/028754 dated Feb. 17, 2022, 9 pgs.

* cited by examiner

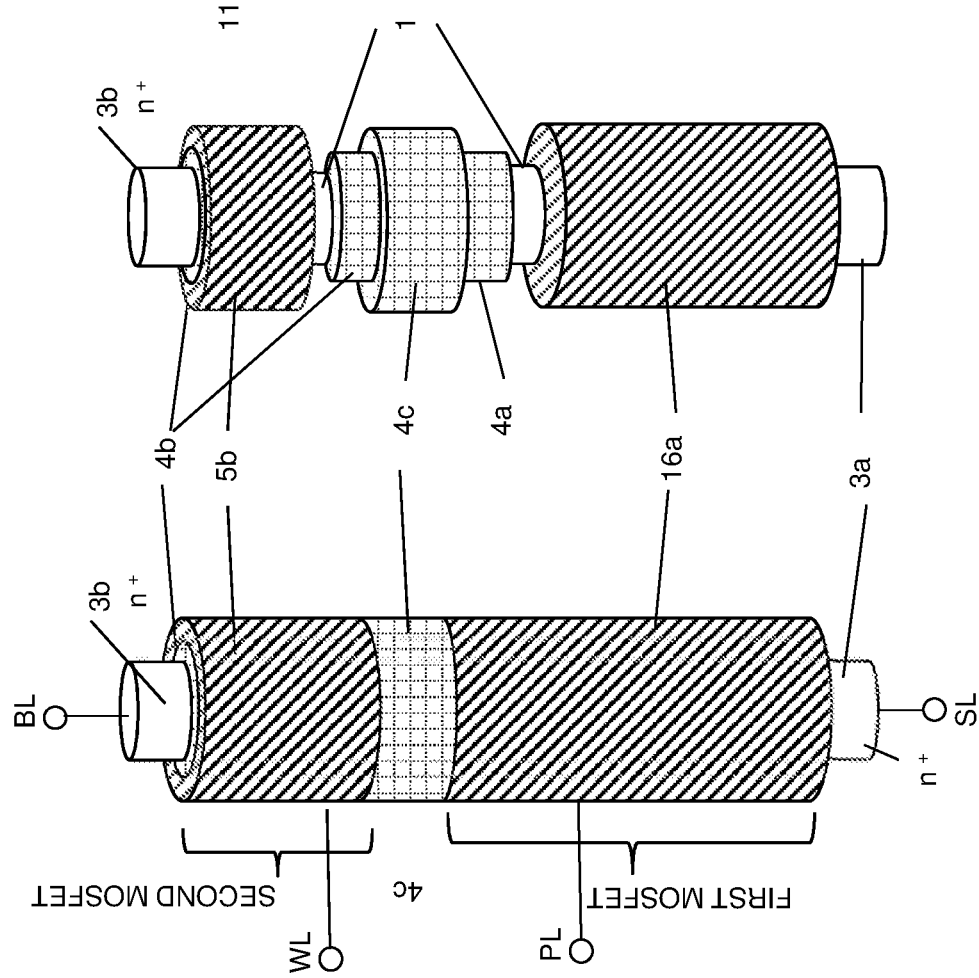

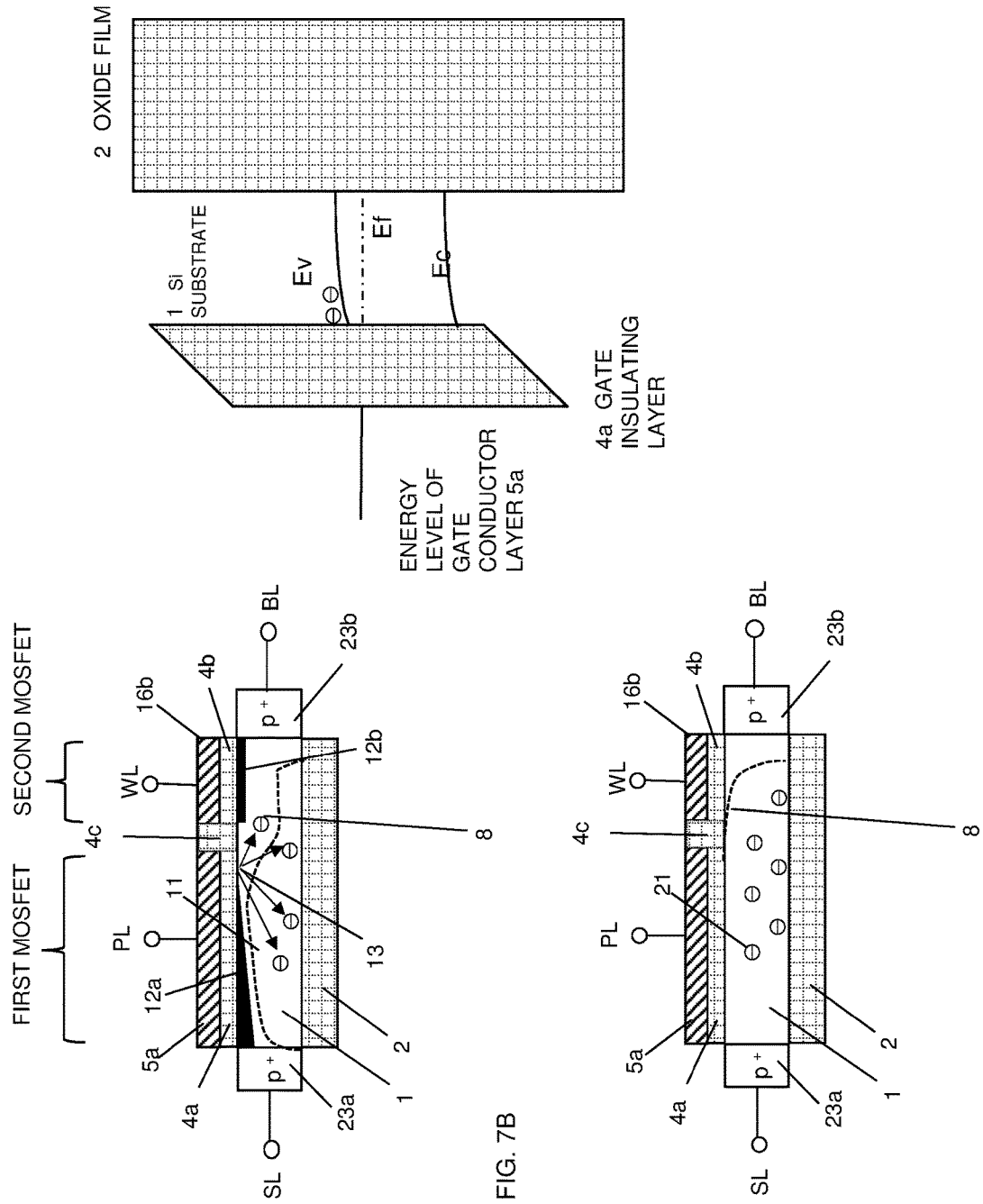

MEMORY DEVICE USING SEMICONDUCTOR ELEMENT

CROSS-REFERENCE TO RELATED APPLICATIONS

This application claims priority to PCT/JP2021/028754 filed Aug. 3, 2021, the enter content of which is incorporated herein by reference.

TECHNICAL FIELD

The present invention relates to a memory device using a semiconductor element.

BACKGROUND ART

High integration, high performance, low electric power consumption, and high functionality of a memory element have been requested in recent development of large scale integration (LSI) technologies.

In a normal planar MOS transistor, a channel extends in a horizontal direction along the upper surface of a semiconductor substrate. However, a channel of an SGT extends in a direction orthogonal to the upper surface of a semiconductor substrate (refer to Non Patent Literature 1, for example). Thus, densification of a semiconductor device is possible with the SGT unlike with the planar MOS transistor. The SGT can be used as a selection transistor to achieve high integration of a dynamic random access memory (DRAM; refer to Non Patent Literature 2, for example) connected to a capacitor, a phase change memory (PCM; refer to Non Patent Literature 3, for example) connected to a resistance change element, a resistive random access memory (RRAM; refer to Non Patent Literature 4, for example), a magneto-resistive random access memory (MRAM; refer to Non Patent Literature 5, for example) that changes resistance by changing the orientation of magnetic spin by current, and the like. In addition, there is, for example, a DRAM memory cell (refer to Non Patent Literature 6) including no capacitor and constituted by one MOS transistor. However, a problem with a DRAM including no capacitor has been that a sufficient voltage margin cannot be obtained due to high dependency on coupling of a gate electrode to a word line of a floating body.

CITATION LIST

Non Patent Literature

[Non Patent Literature 1]
Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[Non Patent Literature 2]
H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)
[Non Patent Literature 3]
H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010)
[Non Patent Literature 4]
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007)
[Non Patent Literature 5]
W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)
[Non Patent Literature 6]
M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)

SUMMARY OF INVENTION

Technical Problem

In a single-transistor DRAM (gain cell) including no capacitor in a memory device, capacitive coupling between a word line and a body including a floating element is large, and amplification of the potential of the word line at data reading and writing is directly transferred as noise to the body of a semiconductor substrate, which has been a problem. As a result, problems such as false reading and false rewriting of stored data occur, and practical use of a single-transistor DRAM (gain cell) including no capacitor has been difficult. Thus, it is needed to solve the above-described problem and densify a DRAM memory cell.

Solution to Problem

To solve the above-described problem, a memory device according to the present invention includes:
a semiconductor substrate extending in a horizontal direction or standing in a vertical direction;
a first gate insulating layer surrounding part or all of a side surface of the semiconductor substrate on one end side;
a second gate insulating layer close or connected to the first gate insulating layer and surrounding part or all of a side surface of the semiconductor substrate on the other end side;
a first gate conductor layer covering the first gate insulating layer;
a second gate conductor layer having a work function different from a work function of the first gate conductor layer covering the second gate insulating layer;
a first impurity layer outside one end of the first gate conductor layer in a direction in which the semiconductor substrate extends and a second impurity layer outside one end of the second gate conductor layer in the direction;
a first wire conductor layer connected to the first impurity layer;
a second wire conductor layer connected to the second impurity layer;
a third wire conductor layer connected to the first gate conductor layer; and
a fourth wire conductor layer connected to the second gate conductor layer, in which
memory write operation is performed by controlling voltage applied to the first wire conductor layer, the second wire conductor layer, the third wire conductor layer, and the fourth wire conductor layer to perform operation of generating electrons and holes in a semiconductor base material by an impact ionization phenomenon with current flowing between the first impurity layer and the second impurity layer or by gate-induced drain leakage current, operation of removing the electrons or holes that are minority carriers in the semiconductor base material among the generated electrons and holes, and operation of leaving, in the semiconductor base material, some or all of the electrons or holes that are majority carriers in the semiconductor base material, and memory erase operation is performed by controlling voltage applied to the first wire conductor layer, the second wire conductor layer, the third wire conductor layer, and the fourth wire conductor layer to remove the left electrons or holes that are the majority carriers in the semiconductor base material (first invention).

A second invention is the above-described first invention in which one of the first wire conductor layer and the second wire conductor layer is a source line, the other wire conductor layer is a bit line, the third wire conductor layer is a plate line, and the fourth wire conductor layer is a word line, the memory erase operation and the memory write operation are performed with voltage applied to the source line, the bit line, the plate line, and the word line, majority carriers in the first impurity layer are electrons, majority carriers in the semiconductor substrate are holes, and the work function of the first gate conductor layer is larger than the work function of the second gate conductor layer (second invention).

A third invention is the above-described first invention in which one of the first wire conductor layer and the second wire conductor layer is a source line, the other wire conductor layer is a bit line, the third wire conductor layer is a plate line, and the fourth wire conductor layer is a word line, the memory erase operation and the memory write operation are performed with voltage applied to the source line, the bit line, the plate line, and the word line, and majority carriers in the first impurity layer are holes, majority carriers in the semiconductor substrate are electrons, and the work function of the first gate conductor layer is smaller than the work function of the second gate conductor layer (third invention).

A fourth invention is the above-described first invention in which the first gate conductor layer and the second gate conductor layer overlap each other and the work functions of the first and second gate conductor layers are different from each other (fourth invention).

BRIEF DESCRIPTION OF DRAWINGS

FIGS. 6A, 6B and 6C are diagrams for description of write operation of a dynamic flash memory cell having a three-dimensional structure according to the first embodiment and the state of carrier accumulation right after the operation.

FIGS. 7A, 7B and 7C are diagrams for description of electron carrier accumulation right after write operation of the dynamic flash memory and an energy band diagram in a case of the one-side electrode according to the first embodiment.

MODE FOR CARRYING OUT THE INVENTION

A structure of a memory device (referred to as a dynamic flash memory) using a semiconductor element according to the present invention, a drive method thereof, and a behavior of accumulation carriers therein will be described below with reference to the accompanying drawings.

First Embodiment

The structure and operation mechanism of a dynamic flash memory cell according to a first embodiment of the present invention will be described below with reference to FIGS. 1A and 1B to 7A, 7B and 7C. The cell structure of the dynamic flash memory when a gate electrode is provided on one side or on each of both sides will be described below with reference to FIGS. 1A and 1B. The writing mechanism and carrier behavior of the dynamic flash memory will be described with reference to FIGS. 2A to 2D, the data erase mechanism thereof will be described with reference to FIGS. 3A to 3C, the writing mechanism and carrier behavior of the dynamic flash memory with both-side electrodes will be described with reference to FIGS. 4A to 4C, the writing mechanism and carrier behavior of the dynamic flash memory when one of the both-side electrodes has a different work function will be described with reference to FIGS. 5A and 5B, the three-dimensional cell structure of the dynamic flash memory and a carrier accumulation situation at writing will be described with reference to FIGS. 6A to 6C, a carrier accumulation situation at writing in a case in which excessive carriers in the dynamic flash memory are electrons will be described with reference to FIGS. 7A to 7C, and the cell structure of the dynamic flash memory when gate conductor layers overlap and a carrier accumulation situation at writing will be described with reference to FIGS. 8A and 8B.

Figure 1A:
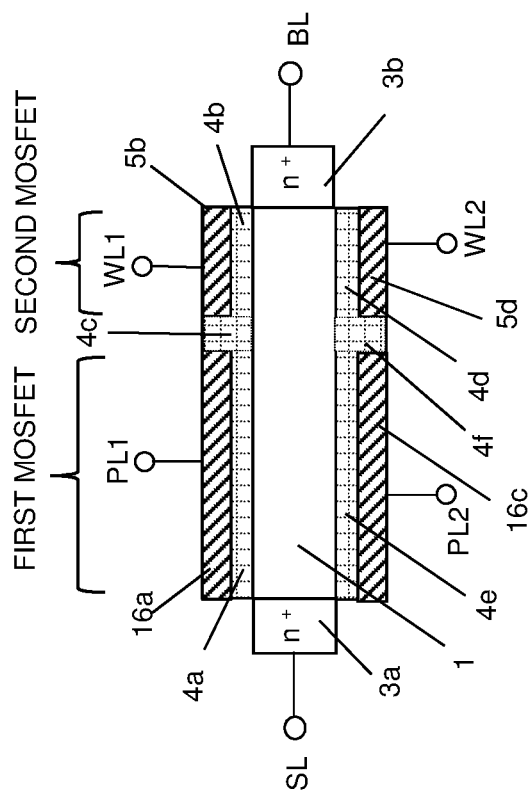
FIGS. 1A and 1B are diagrams illustrating sectional structures of one-side electrode and both-side electrodes of a dynamic flash memory according to a first embodiment.

FIG. 1A illustrates a sectional structure of the dynamic flash memory of a planar type according to the first embodiment of the present invention. An $n^+$ layer $3a$ (hereinafter, a semiconductor region containing donor impurities at high concentration is referred to as an "n⁺ layer") (example of a "first impurity layer" in the claims) is disposed on one side of a substrate 1 (example of a "substrate" in the claims) in the horizontal direction, the substrate 1 being made of a silicon semiconductor containing acceptor impurities and having a p-type or i-type (intrinsic type) conduction type. An n⁺ layer 3b (example of a "second impurity layer" in the claims) is disposed on a side opposite the n⁺ layer 3a. An insulating layer 2 is disposed below the semiconductor substrate 1, and a gate insulating layer 4a (example of a "first gate insulating layer" in the claims) and a gate insulating layer 4b (example of a "second gate insulating layer" in the claims) are disposed above a part to be a channel region of the semiconductor substrate 1. The gate insulating layer 4a and the gate insulating layer 4b are in contact with or close to the n⁺ layers 3a and 3b, respectively. A gate conductor layer 16a (example of a "first gate conductor layer" in the claims) and a gate conductor layer 5b (example of a "second gate conductor layer" in the claims) are disposed above the gate insulating layer 4a. The work function of the gate conductor layer 16a is different from that of the gate conductor layer 5b. The gate conductor layer 16a and the gate conductor layer 5b are separated from each other by an insulating film 4c. Accordingly, the dynamic flash memory cell constituted by the n⁺ layers 3a and 3b, the substrate 1, the gate insulating layer 4a, the gate insulating layer 4b, the gate conductor layer 16a, and the gate conductor layer 5b is formed. The n⁺ layer 3a is connected to a source line SL (example of a "source line" in the claims) that is a wiring electric conductor. The n⁺ layer 3b is connected to a bit line BL (example of a "bit line" in the claims) that is a wiring electric conductor. The gate conductor layer 16a is connected to a plate line PL (example of a "plate line" in the claims) that is a wiring electric conductor. The gate conductor layer 5b is connected to a word line WL (example of a "word line" in the claims) that is a wiring electric conductor. In a memory device of the present embodiment, a plurality of above-described dynamic flash memory cells are two-dimensionally disposed on the substrate 1.

Note that the gate conductor layer 16a, the gate conductor layer 5b, the insulating layer 4a, and the insulating layer 4b are each illustrated as one part in FIG. 1A but may be each divided into a plurality of parts. For example, the gate conductor layer 16a and the gate insulating layer 4a may be each divided into two parts, and the divided parts of the gate conductor layer 16a may be each connected as a conductor electrode of a plate line to the plate line and may be operated in synchronization or out of synchronization.

Figure 1B:
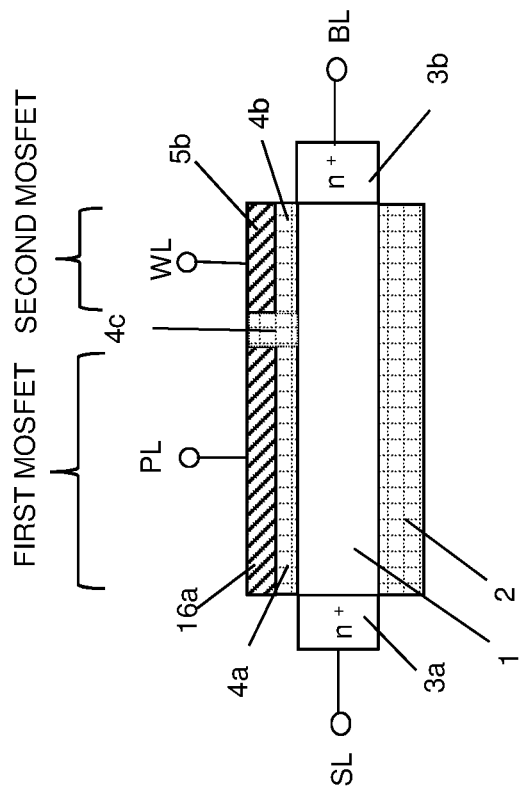

FIG. 1B illustrates an embodiment in which the gate insulating layers 4a and 4b and the gate conductor layers 16a and 5b are provided above the substrate 1 and gate insulating layers 4e and 4d and gate conductor layers 16c and 5d are provided below the substrate 1. As illustrated in FIG. 1B, the gate conductor layer 16a is provided on the gate insulating layer 4a, and the gate conductor layer 16c (example of the "first gate conductor layer" in the claims) is provided below the gate insulating layer 4e (example of the "first gate insulating layer" in the claims). Moreover, the gate conductor layer 16a and the gate conductor layer 16c may be connected as conductor electrodes of plate lines to PL1 and PL2 (examples of the "plate line" in the claims) and operated in synchronization or out of synchronization. Similarly, the gate conductor layer 5b may be provided on the gate insulating layer 4b, the gate conductor layer 5d (example of the "second gate conductor layer" in the claims) may be provided below the gate insulating layer 4d (example of the "second gate insulating layer" in the claims), and the gate conductor layer 5b and the gate conductor layer 5d may be connected as conductor electrodes of word lines to WL1 and WL2 (examples of the "word line" in the claims) and operated in synchronization or out of synchronization. With this configuration as well, dynamic flash memory operation is performed.

In FIG. 1B, the work functions of the gate conductor layer 16a and the gate conductor layer 16c (examples of the "first gate conductor layer" in the claims) are larger than those of the gate conductor layer 5b and the gate conductor layer 5d (examples of the "second gate conductor layer" in the claims), but the same effect is obtained even when the work function of one of the gate conductor layer 16a and the gate conductor layer 16c is different from that of one of the gate conductor layer 5b and the gate conductor layer 5d.

Note that FIGS. 1A and 1B illustrates an example in which the source line SL is connected to the n⁺ layer 3a and the bit line BL is connected to 3b, but the same memory operation is possible even when the bit line BL is connected to the n⁺ layer 3a and the source line SL is connected to 3b.

The substrate 1 is a p-type or i-type semiconductor in FIGS. 1A and B but a profile of impurity concentration may exist in the substrate 1 (example of the "substrate" in the claims). When the n⁺ layers 3a and 3b are each formed as a p⁺ layer (hereinafter, a semiconductor region containing acceptor impurities at high concentration is referred to as a "p⁺ layer") in which majority carriers are holes, dynamic flash memory operation is performed with the substrate as an n-type or i-type semiconductor and with electrons as writing carriers.

Gate materials indicated for the gate conductor layer 5b and the gate conductor layer 5d (examples of the "second gate conductor layer" in the claims) and the gate conductor layer 16a and the gate conductor layer 16c (examples of the "first gate conductor layer" in the claims) may be formed of semiconductors with different impurity concentrations. Alternatively, the gate materials may be a metal or metal nitride such as W, Pd, Ru, Al, TiN, TaN, or WN, an alloy thereof (including silicide), or a laminated structure such as TiN/W/TaN.

The gate conductor layer 5b (example of the "second gate conductor layer" in the claims) and the gate conductor layer 16a (example of the "first gate conductor layer" in the claims) may have shapes overlapping each other.

Figure 2A:
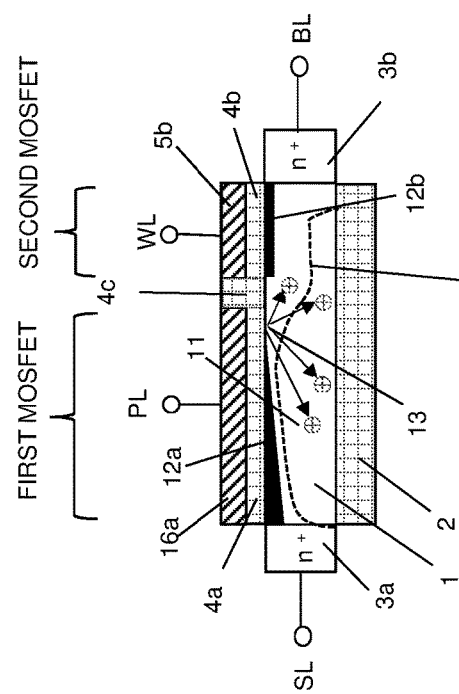
FIGS. 2A, 2B, 2C and 2D are diagrams for description of write operation of the dynamic flash memory, carrier accumulation right after the operation, and an energy band diagram in a case of the one-side electrode according to the first embodiment.

Carrier behavior, accumulation, and an energy band diagram of the dynamic flash memory according to the first embodiment of the present invention illustrated in FIG. 1A at write operation will be described below with reference to FIGS. 2A to 2D. Majority carriers in the n⁺ layer 3a and the n⁺ layer 3b are electrons. For example, n⁺ poly (hereinafter, poly Si containing donor impurities at high concentration is referred to as "n⁺ poly") is used for the gate conductor layer 5b connected to the word line WL, and p⁺ poly (hereinafter, poly Si containing acceptor impurities at high concentration is referred to as "p⁺ poly") is used for the gate conductor layer 16a connected to the plate line PL. For example, 0 V is input to the n⁺ layer 3a connected to the source line SL, for example, 3 V is input to the n⁺ layer 3b connected to the bit line BL, for example, 3 V is input to the gate conductor layer 16a connected to the plate line PL, and for example, 5 V is input to the gate conductor layer 5b connected to the word line WL. As a result, as illustrated in FIG. 2A, a depleted layer region 8 is formed in the substrate 1 directly below the gate insulating layers 4a, 4b, and the insulating film 4c. In a first MOSFET including the gate conductor layer 16a connected to the plate line PL, an inversion layer 12a is formed directly below the gate insulating layer 4a below the gate conductor layer 16a, and potential directly below the gate insulating layer 4b is larger than that of the gate conductor layer 5b. Thus, the inversion layer disappears at part of a second MOSFET after the first MOSFET, and a pinch-off point 13 exists directly below the gate insulating layer 4a below the gate conductor layer 16a connected to the plate line PL. Accordingly, the first MOSFET including the gate conductor layer 16a operates in a saturation region.

In the second MOSFET including the gate conductor layer 5b connected to the word line WL, interface potential of the gate insulating layer 4b in the substrate 1 directly below the gate insulating layer 4b is always lower than that of the gate conductor layer 5b, and thus no pinch-off point exists and an inversion layer 12b is formed on the entire surface. The inversion layer 12b formed on the entire surface below the gate conductor layer 5b connected to the word line WL functions as an effective drain of the first MOSFET including the gate conductor layer 16a. As a result, electric field is maximum in a boundary region between the pinch-off point 13 and the inversion layer 12b in the depleted layer region 8 between the first MOSFET including the gate conductor layer 16a and the second MOSFET including the gate conductor layer 5b, which are connected in series, and an impact ionization phenomenon occurs in the region. Due to the impact ionization phenomenon, electrons accelerated from the $n^+$ layer 3a connected to the source line SL toward the $n^+$ layer 3b connected to the bit line BL collide with an Si lattice, and electron-hole pairs are generated by kinetic energy of the electrons. Some of the generated electrons flow to the gate conductor layer 16a and the gate conductor layer 5b, but most of them flow to the $n^+$ layer 3b connected to the bit line BL.

Note that holes may be generated by causing flow of gate induction drain leakage (GIDL) current instead of causing the above-described impact ionization phenomenon (for example, refer to E. Yoshida, T. Tanaka, "A Capacitorless 1T-DARM Technology Using Gate-Induced Drain-Leakage (GIDL) Current for Low-Power and High-Speed Embedded Memory", IEEE Trans, on Electron Devices vol. 53, pp. 692-697 (2006)).

Figure 2B:
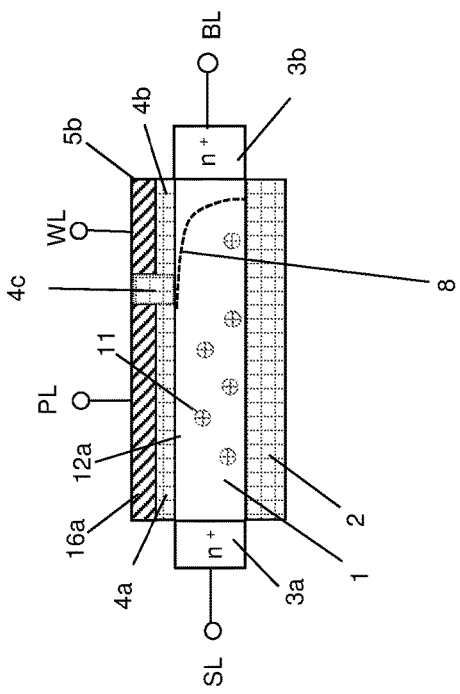
Figure 2C:
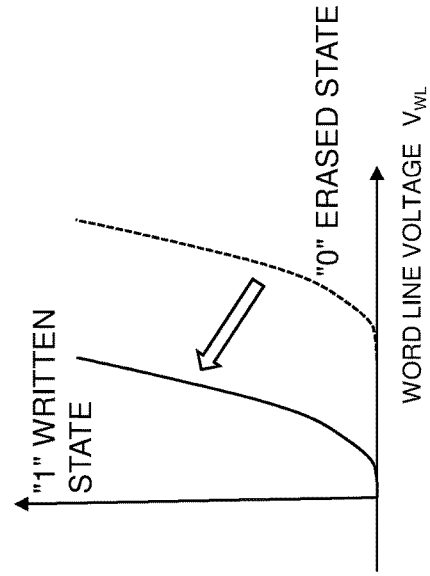
Figure 2D:
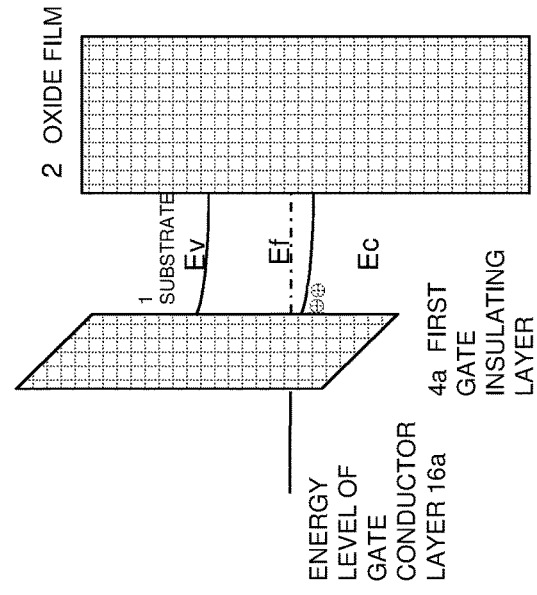

FIG. 2B illustrates the depleted layer region 8 and holes 11 when all biases become 0 V right after writing. The generated holes 11 are majority carriers in the substrate 1 and move due to the gradient of the concentration thereof but are accumulated in the substrate 1 in a short time and charge in positive bias in effect in a non-equilibrium state. Holes in the depleted layer move the source line SL side by electric field and recombine with electrons. Threshold voltages of the first MOSFET and the second MOSFET decrease due to a positive substrate bias effect by holes temporarily accumulated in the substrate 1. Accordingly, as illustrated in FIG. 2C, the threshold voltage of the second MOSFET connected to the word line WL decreases. This write state is allocated to logical storage data "1".

Note that conditions on voltage applied to the bit line BL, the source line SL, the word line WL, and the plate line PL described above are examples for performing write operation and may be other operation conditions with which write operation can be performed. For example, the pinch-off point 13 shifts toward the bit line when, for example, 0 V is input to the $n^+$ layer 3a connected to the source line SL, for example, 3 V is input to the $n^+$ layer 3b connected to the bit line BL, for example, 5 V is input to the gate conductor layer 16a connected to the plate line PL, and for example, 2 V is input to the gate conductor layer 5b connected to the word line WL, but with this method as well, holes can be accumulated in a p layer 1 by the impact ionization phenomenon.

According to a structure of the present invention, since $n^+$ poly is used for the gate conductor layer 5b connected to the word line WL, the second MOSFET is a surface-channel MOSFET as described above and controllability of carrier movement is excellent. Moreover, a drain edge of the first MOSFET, which is extended from the inversion layer 12b generated when the word line WL is positive is extremely sharp, and thus the efficiency of impact ionization improves and "1" writing at the dynamic flash memory can be efficiently performed. Since $p^+$ poly having a work function larger than that of $n^+$ poly is used for the gate conductor layer 16a connected to the plate line PL, excessive holes generated by impact ionization are accumulated near a surface of the substrate 1 adjacent to the gate insulating layer 4a as illustrated with the energy band in FIG. 2D. Thus, controllability of accumulated holes from the conductor layer 16a improves as compared to a case in which $n^+$ poly is used. In addition, since the depleted layer region 8 is formed only near the second MOSFET, an effective volume in which holes can be accumulated increases as compared to a case in which $n^+$ poly is used for the gate conductor layer 16a. Accordingly, the effect of entire substrate bias on the substrate as a memory element increases, the storage holding time increases, and the voltage margin of "1" writing expands.

Note that a combination of $p^+$ poly (work function 5.15 eV) and $n^+$ poly (work function 4.05 eV) is illustrated in FIGS. 2A to 2D as an exemplary combination of the gate conductor layer 16a and the gate conductor layer 5b, but this may be a metal, a metal nitride, an alloy (including silicide), or a laminated structure such as Ni (work function 5.2 eV) and $n^+$ poly, Ni and W (work function 4.52 eV), Ni and TaN (work function 4.0 eV)/W/TiN (work function 4.7 eV).

Figure 3A:
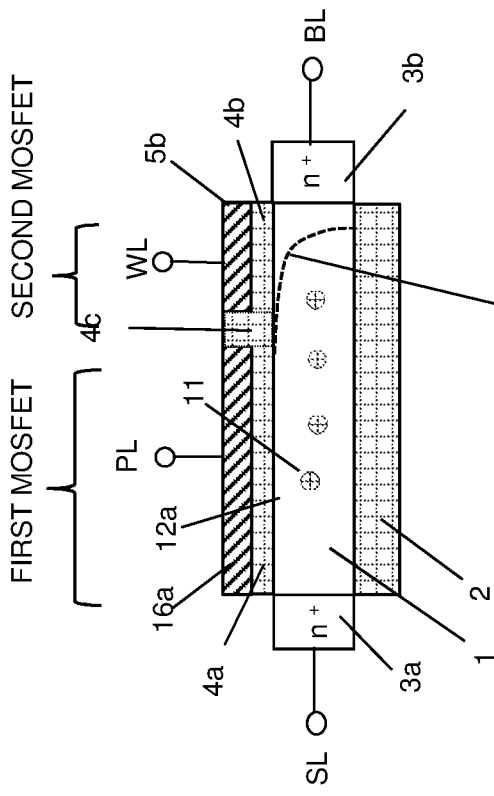
FIGS. 3A, 3B and 3C are diagrams for description of hole carrier accumulation and behavior right after write operation of the dynamic flash memory and erase operation in a case of the one-side electrode according to the first embodiment.
Figure 3B:
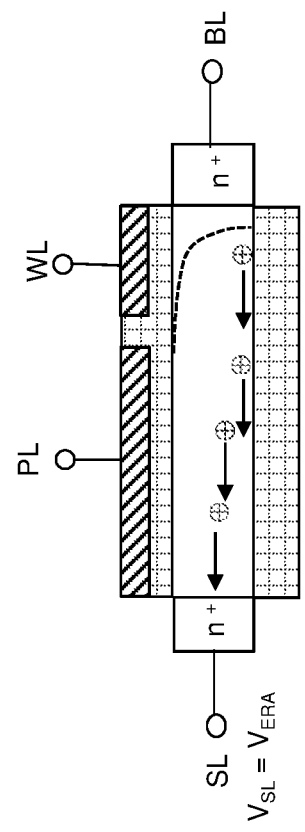
Figure 3C:
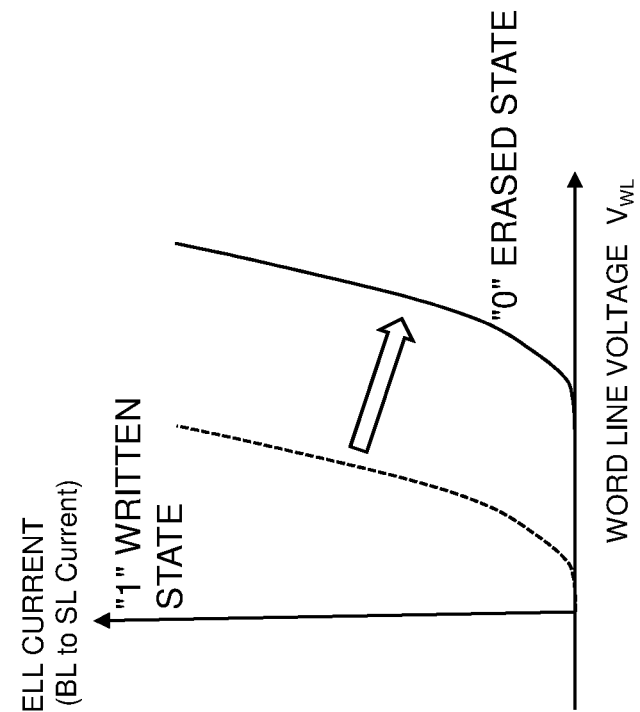

The erase operation mechanism of the dynamic flash memory of the first embodiment illustrated in FIG. 1A will be described below with reference to FIGS. 3A to 3C. FIG. 3A illustrates a state right after the holes 11 generated by impact ionization in the previous cycle are stored in the substrate 1 and all biases become 0 V before erase operation. As illustrated in FIG. 3 B, at erase operation, voltage of the source line SL is set to negative voltage VERA. The voltage VERA is, for example, −3 V. As a result, the $n^+$ layer 3a as a source connected to the source line SL and PN junction of the substrate 1 are forward biased irrespective of the value of the initial potential of the substrate 1. As a result, the holes 11 generated by impact ionization in the previous cycle and stored in a substrate region 1 move to the $n^+$ layer 3a connected to the source line, the potential of the substrate 1 decreases with time, and the threshold voltage of the second MOSFET becomes higher than in "1" writing and returns to an initial state. Accordingly, as illustrated in FIG. 3C, the second MOSFET including the gate conductor layer 5b connected to the word line WL returns to the original threshold value. This erase state of the substrate region 1 is logical storage data "0". Note that, at data reading, a characteristic that no current flows when voltage of the word line WL is set to be high at logical storage data "0" reading as illustrated in FIG. 3C is obtained by setting voltage applied to the gate conductor layer 16a connected to the plate line PL to be higher than a threshold voltage in a case of logical storage data "1" and lower than a threshold voltage in a case of logical storage data "0".

Note that conditions on voltage applied to the bit line BL, the source line SL, the word line WL, and the plate line PL described above are examples for performing erase operation and may be other operation conditions with which erase operation can be performed. For example, even when 1 V is applied to the bit line BL, 2 V is applied to the word line WL, and 0 V is applied to the plate line PL and the source line SL, erase operation can be performed by recombination of holes accumulated in the p layer 1 and electrons injected from the source side. Erase operation can be performed by the same mechanism even when 1 V is applied to the bit line BL, 2 V is applied to the plate line PL, and 0 V is applied to the word line and the source line.

According to a structure of the present embodiment, since $p^+$ poly is used for the gate conductor layer 16a connected to the plate line PL, the state of interface between the substrate 1 and the $n^+$ layer 3a is uniform and almost no depleted layer exists, and recombination of holes and electrons can be extremely efficiently prompted when negative potential is provided to the $n^+$ layer 3a, and accordingly, an erase time can be reduced.

Figures 4A, 4B, 4C:
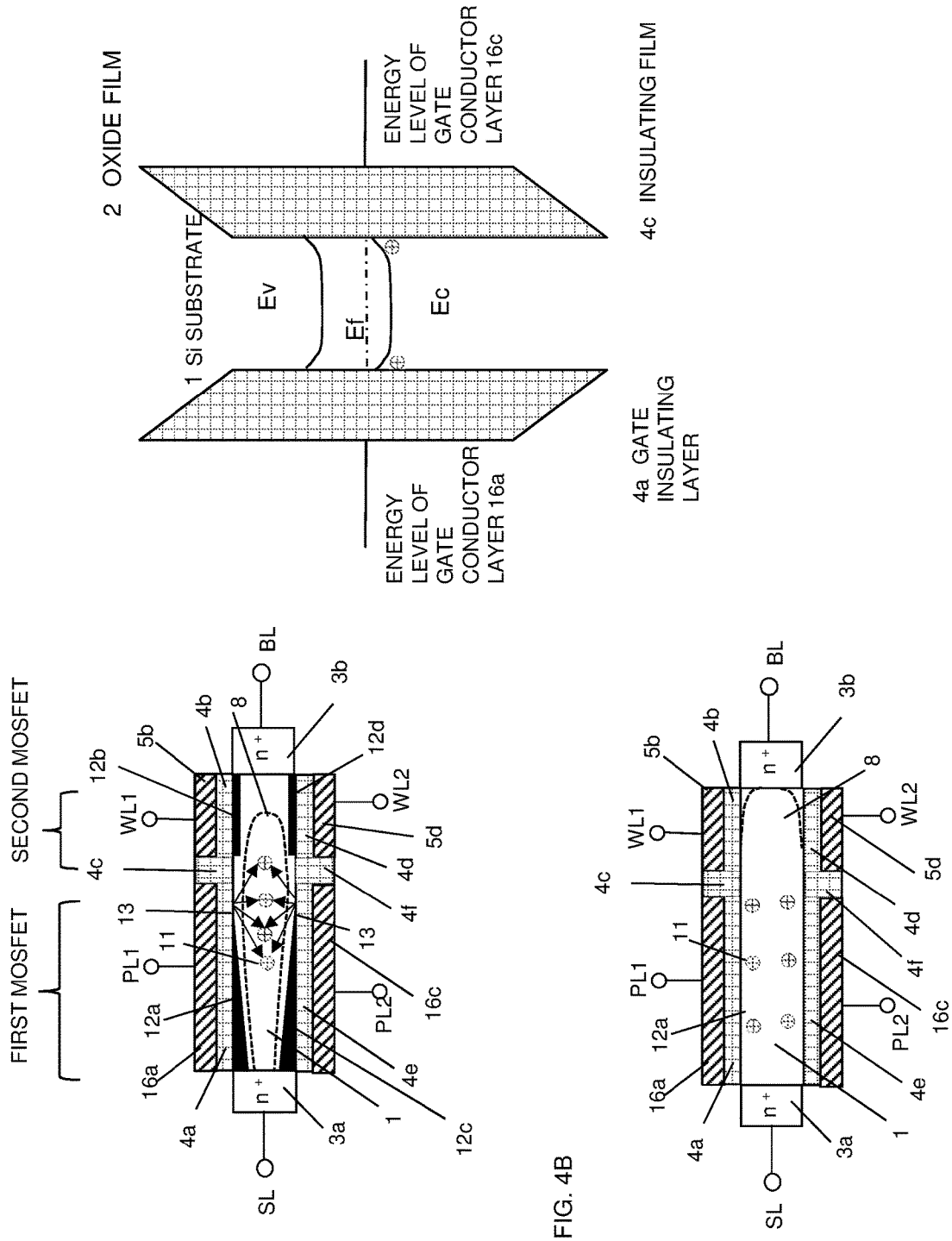
FIGS. 4A, 4B and 4C are diagrams for description of write operation of the dynamic flash memory, hole carrier accumulation right after the operation, and an energy band diagram in a case of the both-side electrodes according to the first embodiment.

Hole carrier behavior, accumulation, and an energy band diagram in a writing state of the dynamic flash memory when gate conductor layers are provided above and below the substrate and each gate conductor layer is divided in a plurality of parts as in the embodiment illustrated in FIG. 1B of the present invention will be described below with reference to FIGS. 4A to 4C. As illustrated in FIG. 4A, the gate conductor layer 16a and the gate conductor layer 16c are formed by using $p^+$ poly on the gate insulating layer 4a and the insulating film 4c, respectively, and the gate conductor layer 5b and the gate conductor layer 5d is formed by using $n^+$ poly on the gate insulating layer 4b and the insulating layer 4d, respectively. For example, like in the above description with reference to FIGS. 2A to 2D, for example, 0 V is input to the $n^+$ layer 3a connected to the source line SL, for example, 3 V is input to the $n^+$ layer 3b connected to the bit line BL, for example, 3 V is input to the gate conductor layer 16a and the gate conductor layer 16c connected to the plate lines PL1 and PL2, respectively, and for example, 5 V is input to the gate conductor layer 5b and the gate conductor layer 5d connected to the word lines WL1 and WL2, respectively. As a result, as illustrated in FIG. 4A, the depleted layer region 8 is formed in the substrate 1 directly below the gate insulating layers 4a, 4b, 4d, 4e, and the insulating films 4c and 4f. The first MOSFET including the gate conductor layer 16a and the gate conductor layer 16c operates in the saturation region, electric field is maximum in a boundary region between the pinch-off point 13 and the inversion layer 12b or 12d in the depleted layer region 8, and the impact ionization phenomenon occurs in this region. Due to the impact ionization phenomenon, electrons accelerated from the $n^+$ layer 3a connected to the source line SL toward the $n^+$ layer 3b connected to the bit line BL collide an Si lattice, and electron-hole pairs are generated by kinetic energy of the electrons.

As illustrated in FIG. 4A, the generated holes 11 are accumulated in the substrate region 1 in a short time and charge in positive bias in effect in a non-equilibrium state. The threshold voltage of the second MOSFET connected to the word line WL decreases and "1" writing can be performed. In FIG. 4B, the state of the accumulated holes 11 at a moment when all biases are set to zero right after "1" writing to the dynamic flash memory is illustrated together with the depleted layer region 8. As for the energy band in this state, as illustrated in FIG. 4C, the generated holes are accumulated near the interface between the substrate 1 and each of the gate insulating layer 4a and the gate insulating layer 4b, and controllability of the accumulated holes from the gate conductor layer 16a and the gate conductor layer 16c improves as compared to in a case in which $n^+$ poly is used. Moreover, since the depleted layer region 8 is formed only near the second MOSFET, an effective volume in which holes can be accumulated increases as compared to a case in which $n^+$ poly is used for the gate conductor layer 16a and the gate conductor layer 16c. Accordingly, the effect of entire substrate bias on the substrate as a memory element increases, the storage holding time increases, and the voltage margin of "1" writing expands. For the reason described with reference to FIGS. 3A to 3C, the effect of reducing the erase time is obtained in a case of erasure as well.

Note that, in the example illustrated in FIGS. 4A to 4C, the same voltage is provided to the plate lines PL1 and PL2 and the same voltage is provided to the word lines WL1 and WL2, but voltages independent from each other may be separately provided thereto and the same effect of the present invention is obtained by providing synchronized voltages as well.

Figure 5A:
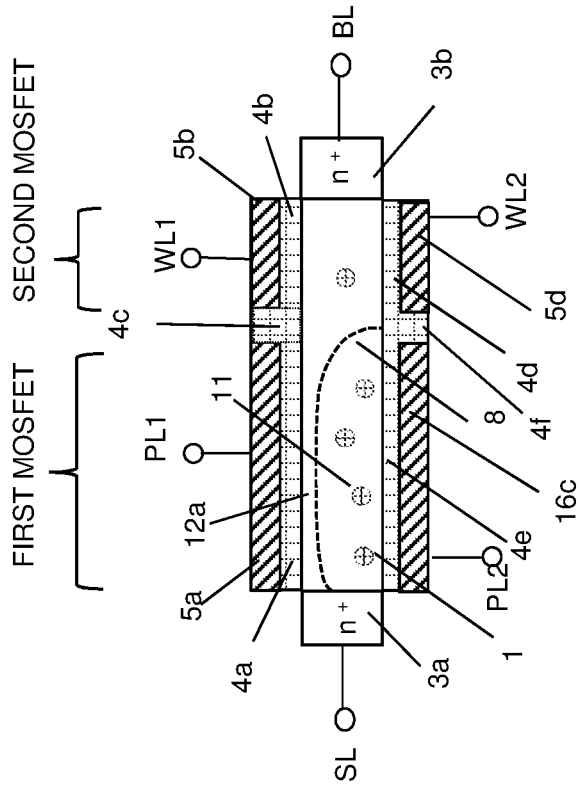
FIGS. 5A and 5B are diagrams for description of write operation of the dynamic flash memory, carrier accumulation right after the operation, and an energy band diagram in a case in which a gate electrode having a high work function is used as one of the both-side electrodes according to the first embodiment.
Figure 5B:
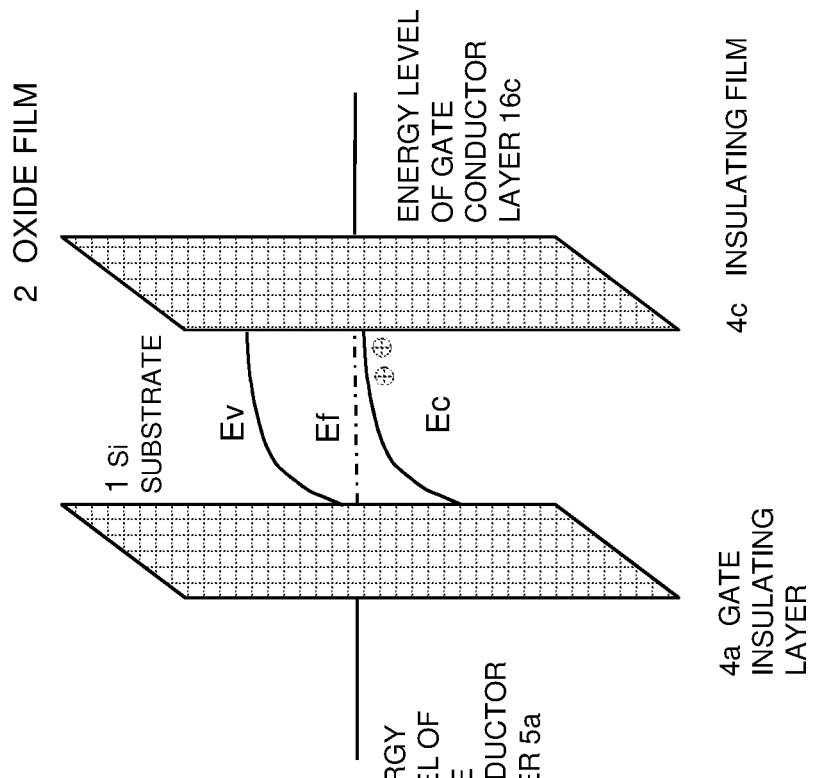

The same material is used for the gate conductor layer 16a and the gate conductor layer 16c connected to the plate lines PL1 and PL2 in FIGS. 4A to 4C, but the same effect is obtained by applying a material having a different work function to only one of them. For example, in the example illustrated in FIGS. 5A and 5B, $n^+$ poly is used for a gate conductor layer 5a, $p^+$ poly is used for the gate conductor layer 16c, and they are connected to the plate lines PL1 and PL2, respectively. Writing conditions are the same as bias conditions described with reference to FIGS. 4A to 4C. FIG. 5B illustrates the status of holes right after write operation of "1" to the dynamic flash memory and an energy band at that time. In this case as well, right after writing, holes are accumulated directly below the insulating film 4c contacting the gate conductor layer 16c side, and similarly to the above description, hole accumulation efficiency improvement at "1" writing and the effect of reducing the erase operation time are obtained.

The present invention is effective not only for a structure in which elements are formed on a plane of the substrate 1 as described above but also for a dynamic flash memory based on an SGT having a three-dimensional structure as illustrated in FIGS. 6A to 6C. FIG. 6A illustrates a dynamic flash memory in which the gate conductor layer 16a is formed by using $p^+$ poly around the gate insulating layer 4a and the gate conductor layer 5b is formed by using $n^+$ poly around the gate insulating layer 4b. The gate conductor layer 16a and the gate conductor layer 5b have work functions of different values. FIG. 6B illustrates a structure in which some films are removed to facilitate further understanding of the three-dimensional structure. For example, in this structure, for example, 0 V is input to the $n^+$ layer 3a connected to the source line SL, for example, 3 V is input to the $n^+$ layer 3b connected to the bit line BL, for example, 3 V is input to the gate conductor layer 16a connected to the plate line PL, and for example, 5 V is input to the gate conductor layer 5b connected to the word line WL. As a result, the first MOSFET including the gate conductor layer 16a operates in the saturation region, and the generated holes 11 are accumulated in the substrate region 1 in a short time and charge in positive bias in effect in a non-equilibrium state. The threshold voltage of the second MOSFET connected to the word line WL decreases, and "1" writing can be performed. FIG. 6C illustrates the state of the accumulated holes 11 at a horizontal section of the gate conductor layer 16a at a moment when all biases are set to zero right after "1" writing to the dynamic flash memory. As illustrated in FIG. 6C, the generated holes are accumulated near the interface between the substrate 1 and the gate insulating layer 4a, and control force on the accumulated holes from the gate conductor layer 16a increases as compared to a case in which n⁺ poly is used. Moreover, since the depleted layer region 8 is formed only near the second MOSFET, an effective volume in which holes can be accumulated increases as compared to a case in which n⁺ poly is used. Accordingly, the effect of entire substrate bias on the substrate as a memory element increases, the storage holding time increases, and the voltage margin of "1" writing expands. For the reason described with reference to FIGS. 3A to 3C, the effect of reducing the erase time is obtained in a case of erasure as well.

The same effect is obtained also when a dynamic flash memory in which majority carriers in the substrate 1 are electrons and majority carriers for 3a and 3b illustrated in FIGS. 2A to 2D are holes. FIG. 7A illustrates write operation in the structure of the dynamic flash memory in which majority carriers in the substrate 1 are electrons. For example, it is assumed that p⁺ poly is used for a gate conductor layer 16b connected to the word line WL and n⁺ poly is used for the gate conductor layer 5a connected to the plate line PL. The second MOSFET is a surface-channel MOSFET in which majority carriers are holes, controllability of carrier movement is excellent, a drain edge of the second MOSFET which is extended from the inversion layer is extremely sharp, and thus the efficiency of impact ionization improves and "1" writing at the dynamic flash memory can be efficiently performed. Excessive electrons generated by impact ionization are accumulated near the surface of the plate line PL, controllability of the accumulated electrons from the gate conductor layer 5a improves as compared to a case in which p⁺ poly is used, and thus the effect of entire substrate bias on the substrate as a memory element increases. Moreover, since the depleted layer region 8 is formed only near the second MOSFET, an effective volume in which electrons can be accumulated increases as compared to a case in which p⁺ poly is used for the gate conductor layer 5a. Accordingly, the storage holding time increases and the voltage margin of "1" writing expands (in this case, logic data "1" when excessive electrons exist in the substrate). In addition, in a case of erasure as well, the effect of reducing the erase time is obtained for the reason described above, and the operation margin of the dynamic flash memory improves.

Figure 8A:
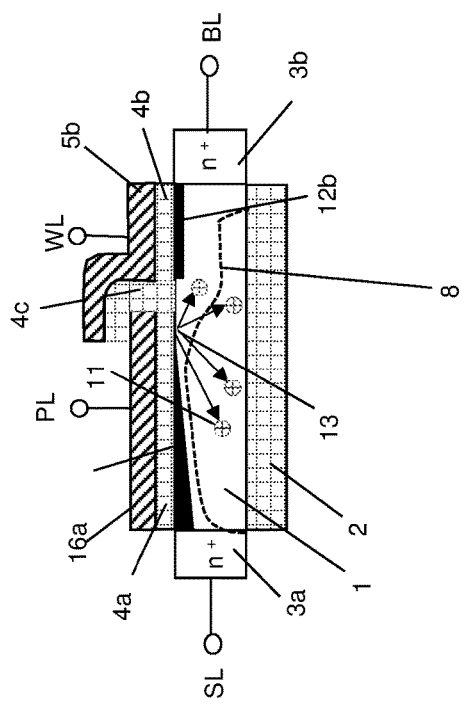
FIGS. 8A and 8B are diagrams for description of write operation of the dynamic flash memory in which a gate connected to a word line WL and a plate line PL has an overlapping structure in a dynamic flash memory structure using the one-side electrode according to the first embodiment, and carrier accumulation right after the operation.
Figure 8B:
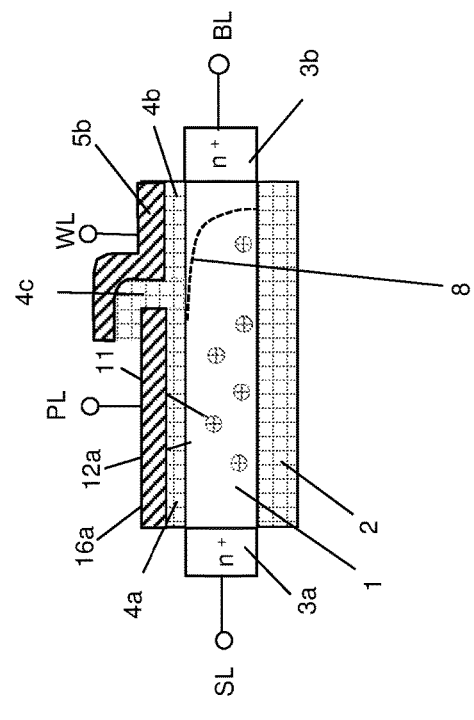

The above description is made on a structure in which the gate conductor layer 5b connected to the word line WL and the gate conductor layer 16a do not overlap as illustrated in FIGS. 2A to 2D, but the completely same effect is obtained for the dynamic flash memory according to the present invention with a structure in which the gate conductor layer 5b and the conductor layer 16a overlap as illustrated in FIGS. 8A and 8B.

The present embodiment has the following characteristics.

(Characteristic 1)

Since gate conductor layers having different work functions are used in writing to the dynamic flash memory according to the first embodiment of the present invention, majority carriers accumulated in the substrate for writing are accumulated directly below a gate conductor layer connected to the plate line PL in writing of logic data "1", and accordingly, the amount of the accumulation is large and an information holding time is long. At data erasing, since no depleted layer is formed at the interface with the n⁺ layer 3a connected to the source line SL, erasure can be performed in a short time. Accordingly, the operation margin of the memory is expanded and electric power consumption of the memory is reduced, which leads to high-speed operation of the memory.

(Characteristic 2)

Since the gate conductor layer 16a and the gate conductor layer 16c in FIGS. 1A and 1B have work functions different from that of a gate conductor layer connected to the word line WL when excessive carriers are accumulated at logic data "1" writing to the dynamic flash memory, excessive carriers are accumulated directly below the gate insulating layer 4a or the insulating film 4c directly below the gate conductor layer 16a or the gate conductor layer 16c, and accordingly, a long data holding time is achieved and the dynamic flash memory can have an expanded operation voltage margin. In erasure of logic data "1" to "0", as well, since no depleted layer is formed at a part where excessive carriers are removed, the erase time can be shortened. Accordingly, a higher-density and high-performance dynamic flash memory can be achieved.

(Characteristic 3)

The present invention is applicable to a dynamic flash memory of any structure, and the effect of the present invention is achieved when the work function of any one of the gate conductor layers connected to the plate line PL and the source line SL, respectively, can be changed.

(Characteristic 4)

In a dynamic flash memory having a structure in which the gate conductor layers connected to the plate line PL and the source line SL, respectively, overlap each other, as well, the same effect can be achieved by changing the work functions of the gate conductor layers.

The present invention can have various embodiments and modifications without departing from the spirit and scope of the present invention. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

INDUSTRIAL APPLICABILITY

When a memory function using a semiconductor element according to the present invention is used, a high-speed dynamic flash memory with a longer storage time and less electric power consumption than in conventional cases can be provided.

The invention claimed is:

1. A memory device using a semiconductor element, the memory device comprising:
   a semiconductor substrate formed in a columnar shape having a first columnar portion located along a length of the semiconductor substrate near one end of the semiconductor substrate and a second columnar portion located, next to the first columnar portion, along the length of the semiconductor substrate near the other end of the semiconductor substrate;
   a first gate insulating layer surrounding at least a part of a side surface of the first columnar portion of the semiconductor substrate;
   a second gate insulating layer surrounding at least a part of a side surface of the second columnar portion of the semiconductor substrate;

a first gate conductor layer surrounding the first gate insulating layer;

a second gate conductor layer surrounding the second gate insulating layer, wherein the second gate conductor layer is not electrically connected to the first gate conductor layer and has a work function different from a work function of the first gate conductor layer;

a first impurity layer provided to one end of the semiconductor substrate on a side of the first columnar portion and a second impurity layer provided to the other end of the semiconductor substrate on a side of the second columnar portion;

wherein the first impurity layer, the second impurity layer, the first gate conductor layer and the second gate conductor layer are arranged such that voltages applied to the first impurity layer, the second impurity layer, the first gate conductor layer and the second gate conductor layer are controlled to (i) perform a memory write operation that generates a group of electrons and a group of holes in the semiconductor substrate by an impact ionization phenomenon caused by a current flowing between the first impurity layer and the second impurity layer or by gate-induced drain leakage current, and removes one of the group of electrons or the group of holes, which is minority carriers from the semiconductor substrate leaving, in locations within the semiconductor substrate contacting the first gate insulating layer and the second gate insulating layer, some or all of the other of the group of electrons or the group of holes, which are majority carriers in the semiconductor substrate, and (ii) perform a memory erase operation that removes from the semiconductor substrate the other of the group of electrons or the group holes, which are the majority carriers in the semiconductor substrate.

2. The memory device using the semiconductor element according to claim 1, wherein one of the first or second impurity layer is connected with a source line, the other thereof is connected with a bit line, the first gate conductor layer is connected with a plate line, and the second gate conductor layer is connected with a word line, the memory erase operation and the memory write operation are performed with voltages applied to the source line, the bit line, the plate line, and the word line, and the majority carriers in the first impurity layer are electrons, the majority carriers in the semiconductor substrate are holes, and the work function of the first gate conductor layer is larger than the work function of the second gate conductor layer.

3. The memory device using the semiconductor element according to claim 1, wherein one of the first or second impurity layer is connected with a source line, the other thereof is connected with a bit line, the first gate conductor layer is connected with a plate line, and the second gate conductor layer is connected with a word line, the memory erase operation and the memory write operation are performed with voltages applied to the source line, the bit line, the plate line, and the word line, and the majority carriers in the first impurity layer are holes, the majority carriers in the semiconductor substrate are electrons, and the work function of the first gate conductor layer is smaller than the work function of the second gate conductor layer.

4. The memory device using the semiconductor element according to claim 1, wherein the first gate conductor layer and the second gate conductor layer are overlapped with each other and the work functions of the first and second gate conductor layers are different from each other.

* * * * *